United States Patent
Ikeda

(10) Patent No.: US 9,214,703 B2
(45) Date of Patent: Dec. 15, 2015

(54) SECONDARY CELL AND METHOD FOR TESTING SECONDARY CELL

(75) Inventor: Mitsuhiro Ikeda, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 417 days.

(21) Appl. No.: 13/813,188

(22) PCT Filed: Jan. 23, 2012

(86) PCT No.: PCT/JP2012/000377
§ 371 (c)(1),
(2), (4) Date: Jan. 30, 2013

(87) PCT Pub. No.: WO2012/117660
PCT Pub. Date: Sep. 7, 2012

(65) Prior Publication Data
US 2013/0127473 A1    May 23, 2013

(30) Foreign Application Priority Data

Mar. 1, 2011   (JP) .................................. 2011-043477

(51) Int. Cl.
*G01N 27/416*   (2006.01)
*H01M 10/48*   (2006.01)
(Continued)

(52) U.S. Cl.
CPC .......... *H01M 10/48* (2013.01); *H01M 10/0431* (2013.01); *H01M 10/0587* (2013.01); *H01M 10/615* (2015.04); *G01R 31/025* (2013.01); *G01R 31/3627* (2013.01)

(58) Field of Classification Search
CPC .. G01R 31/025; G01R 31/3627; H01M 10/48
USPC .................. 324/426, 437; 429/61, 62, 90, 94; 361/93.8
See application file for complete search history.

(56) References Cited

U.S. PATENT DOCUMENTS 5,728,482 A   3/1998   Kawakami et al.
5,773,158 A   6/1998   Sawamura et al.
(Continued)

FOREIGN PATENT DOCUMENTS

CN   101499543   8/2009
CN   101553950   10/2009
(Continued)

OTHER PUBLICATIONS

English Translation of Search Report dated Jul. 14, 2014 for Chinese Patent Application No. 201280001996.7.
(Continued)

*Primary Examiner* — Richard Isla Rodas
*Assistant Examiner* — Nathaniel Pelton
(74) *Attorney, Agent, or Firm* — Wenderoth, Lind & Ponack, L.L.P.

(57) ABSTRACT

The present invention provides a secondary cell, wherein an area having generated therein a phenomenon due to an internal short-circuit can be freely changed, a change in the secondary cell due to the generation of the internal short-circuit is correctly grasped, and safety of the secondary cell can be accurately evaluated when the internal short-circuit is generated. An internal short-circuit test method for the secondary cell is also provided. In the present invention, the secondary cell is configured by disposing: an electrode group, which is formed by winding or laminating a positive electrode plate, a negative electrode plate, and an insulating layer disposed between the positive electrode plate and the negative electrode plate; and a heat generating body, which is disposed between the positive electrode plate and the insulating layer or between the negative electrode plate and the insulating layer.

5 Claims, 6 Drawing Sheets

(51) Int. Cl.
*H01M 10/04* (2006.01)
*H01M 10/0587* (2010.01)
*H01M 10/615* (2014.01)
G01R 31/36 (2006.01)
G01R 31/02 (2006.01)

(56) References Cited

U.S. PATENT DOCUMENTS

| | | | |
|---|---|---|---|
| 5,948,464 | A | 9/1999 | Delnick |
| 6,054,233 | A | 4/2000 | Vourlis |
| 8,163,409 | B2 | 4/2012 | Fujikawa et al. |
| 8,168,314 | B2 | 5/2012 | Fujikawa et al. |
| 2002/0068202 | A1 | 6/2002 | Gebhardt et al. |
| 2008/0143337 | A1 | 6/2008 | Fujikawa et al. |
| 2009/0087723 | A1 | 4/2009 | Inda |
| 2009/0286148 | A1* | 11/2009 | Fujikawa et al. ............ 429/149 |
| 2011/0005249 | A1* | 1/2011 | Kim et al. ....................... 62/208 |
| 2011/0310562 | A1* | 12/2011 | Strader et al. ................ 361/704 |

FOREIGN PATENT DOCUMENTS

| | | |
|---|---|---|
| JP | 8-255678 | 10/1996 |
| JP | 9-231962 | 9/1997 |
| JP | 10-106530 | 4/1998 |
| JP | 2002-515637 | 5/2002 |
| JP | 2002-540585 | 11/2002 |
| JP | 2009-87814 | 4/2009 |
| JP | 2009-158266 | 7/2009 |
| JP | 2009-193729 | 8/2009 |

OTHER PUBLICATIONS

International Search Report of PCT Application No. PCT/JP2012/000377 dated May 1, 2012.

* cited by examiner

SECONDARY CELL AND METHOD FOR TESTING SECONDARY CELL

TECHNICAL FIELD

The present invention relates to a secondary cell in which a heater is embedded, and a method for testing the secondary cell.

BACKGROUND ART

A lithium secondary cell is a cell having a small size and a high energy density. In recent years, lithium secondary cells have attracted attention mainly as a power supply for a portable apparatus and a power supply for an electric vehicle in which a high capacity and a high output are necessary. From such a background, research and development on lithium secondary cells has been actively conducted in various countries, and the realization of a safe and high-capacity cell is imperative.

The lithium secondary cell includes an insulating layer that is disposed between a positive electrode plate and a negative electrode plate and has a function of electrically insulating the respective electrode plates and maintaining an electrolytic solution therein. The insulating layer has a property of easily contracting. Accordingly, in a case of keeping the lithium secondary cell in an extremely high temperature environment for a long time, the positive electrode plate and the negative electrode plate may come into physical contact with each other and thus an internal short-circuit may occur. In addition, the insulating layer may be broken due to a conductive particle (foreign matter) that is attached to the surfaces of the positive electrode plate, the negative electrode plate, and the insulating layer, and thus the positive electrode plate and the negative electrode plate may be electrically connected to each other and an internal short-circuit may occur. In particular, the recent development of lithium secondary cells has been done to realize a high capacity and thus there is a tendency for the insulating layer to be made to be thinner. As a result, the problem of the above-described internal short-circuit is becoming more important.

In addition, when an internal short-circuit between the positive electrode plate and the negative electrode plate occurs once, a short-circuit portion is further enlarged due to joule heat accompanying a short-circuit current and at the same time, abnormal heating occurs, and thus the cell may be broken. On the other hand, even when an internal short-circuit occurs in the cell, securement of safety by suppressing of the above-described breakage is very important. In recent years, research and development into a technology of raising safety under an internal short-circuit of the cell has been also actively conducted. For example, a technology in which an insulating layer formed from ion permeable ceramic particles and a binder is laminated on electrode plates (refer to PTL 1), or the like has been suggested.

On the other hand, even when an internal short-circuit occurs in the cell, it is very important to accurately evaluate the safety of the cell for securing safety of the cell in which an internal short-circuit occurs. In addition, in the related art, a cell evaluation test (safety evaluation items of cell such as a lithium secondary cell) that evaluates the operation of heat generation due to an internal short-circuit is established as UL standard (UL1642) for lithium cells, guidelines (JIS B8714) from cell industry society, and the like. Examples of such an evaluation test include a nail penetration test, a crushing test, and the like.

In the nail penetration test, a cell is pricked with a nail from the outside to cause short-circuiting of the positive electrode plate and the negative electrode plate by the nail, and the variation in temperature, voltage, or the like of the cell, which is caused by the joule heat generation that occurs, is measured (refer to PTL 2). As shown in FIG. 5, PTL 2 discloses a method in which nail 44 is made to penetrate through an insulation layer 412 and an insulation resistance is measured until nail 44 reaches current collector 416. According to this method, a pseudo internal short-circuit due to foreign matter is simulated. The crushing test is a test in which the cell is physically deformed by a round bar, a square bar, a flat plate, or the like to cause an internal short-circuit to occur between the positive electrode plate and the negative electrode plate, and then the variation in temperature, voltage, or the like of the cell is measured.

Furthermore, a cell having a structure in which a fracture mechanism is provided inside the cell so as to prevent smoking, ignition and the like, when occurring an internal short-circuit in single cell article is also suggested (refer to PTL 3 and PTL 4). As shown in FIGS. 6A-6B, this fracture mechanism is configured in such a manner that when an external pressure is applied to burrs 58 provided in the vicinity of housing 51 inside the cell, burrs 58 make a hole in part of separator 72. Accordingly, an internal short-circuit occurs between the outermost layer of positive electrode 60 and the outermost layer of negative electrode 50 of electrode assembly 30 that is spirally wound. Due to this fracture mechanism, in the above-described crushing test, burrs 58 that are provided on the negative electrode plate make a hole in separator 72, and thus the short-circuit is caused to occur between the positive electrode plate and the negative electrode plate. Accordingly, a cell voltage decreases so as to prevent smoking and ignition from occurring during the occurrence of an internal short-circuit.

However, for the cell provided with the fracture mechanism, a manufacturing process of the cell is difficult. In addition, when the fracture mechanism is provided, possibility of deterioration in safety of the cell itself cannot be denied. In addition, it is impossible to specify at which place of the cell an internal short-circuit due to intrusion of foreign matter occurs. Accordingly, even when the fracture mechanism is provided, it cannot be considered that the safety of the cell according to an internal short-circuit is high.

In addition, a cell in which a heater is embedded is disclosed. As this cell, for example, a secondary cell in which the heater is disposed in a sheet-shaped laminated structure is disclosed (for example, refer to PTL 5 and PTL 6). For example, the heater is disposed across substantially the entire surface of an insulating layer. In such secondary cell, a temperature of the entire inside of the cell is maintained at a desired temperature. According to this temperature control, a high output and a large discharge capacity may be obtained under a low-temperature environment.

Furthermore, as the cell in which the heater is embedded, a fuel cell, which is provided with a linear heater that heats an electrolyte, is disclosed (For example, refer to PTL 7). The heater is one linear heat generating body that is across an active cell surface of a fuel cell unit. The heater heats the electrolyte to a temperature equal to or higher than a freezing point of the electrolyte. According to this heating operation, only the electrolyte, which is immediately close to the linear heater, is heated. However, reaction heat of a cell reaction in the heated electrolyte further propagates to the neighboring electrolyte, and thus a heated region is broadened. In this manner, the fuel cell can quickly operate under a low temperature environment.

In addition, a heater is disclosed which includes a heat generating unit and a lead unit that are configured by a conductive ceramic material layer (for example, refer to PTL 9 and PTL 10). The heat generating unit is formed from a thin conductive ceramic material layer having a shape folded in a zigzag manner. The lead unit is formed from the conductive ceramic material in a thickness that is sufficiently larger than that of each conductive ceramic material layer. By this heater, a temperature of the heat generating unit may be raised to 1,000 to 1,500° C. within 10 seconds.

CITATION LIST

Patent Literature

PTL 1: Japanese Patent Application Laid-Open No. HEI10-106530
PTL 2: Japanese Patent Application Laid-Open No. 2009-158266
PTL 3: Japanese Translation of a PCT Application Laid-Open No. 2002-515637
PTL 4: U.S. Pat. No. 6,054,233
PTL 5: Japanese Patent Application Laid-Open No. 2009-087814
PTL 6: US Patent Application Laid-Open No. 2009/0087723
PTL 7: Japanese Translation of a PCT Application Laid-Open No. 2002-540585
PTL 9: Japanese Patent Application Laid-Open No. HEI08-255678
PTL 10: U.S. Pat. No. 5,773,158

SUMMARY OF INVENTION

Technical Problem

When considering the use of a cell, it is necessary to correctly grasp an internal variation of the cell during occurrence of an internal short-circuit and determine the safety level of the cell.

However, in the test method in the related art, there is a problem in that it is difficult to accurately evaluate the safety with respect to an internal short-circuit of the cell.

From research in the related art, it is found that the internal variation of the cell under an internal short-circuit is largely different depending on where a short-circuit occurs inside the cell. For example, it is difficult for ignition or smoking to occur due to heat dissipation from a short-circuit that occurs in the vicinity of a surface of the cell compared to a short-circuit that occurs inside the cell. In other words, safety is high.

In addition, at the inside of the cell, electrical resistance at a portion in the vicinity of a current collector is relatively low, and the electrical resistance at a portion that is distant from the current collector is relatively high. Accordingly, when the short-circuit simultaneously occurs at both of a part in the vicinity of the current collector and a part distant from the current collector, a large amount of short-circuit current flows to the part in the vicinity of the current collector, the electrical resistance of the part in the vicinity of the current collector being relatively lower. As a result, a relatively large amount of joule heat generates at the part in the vicinity of the current collector. Therefore, in the above-described simultaneous internal short-circuit, a cell function (voltage) decreases, but commonly, it does not reach smoking or ignition. Accordingly, it may determine that the safety with respect to an internal short-circuit of the cell is high. As described above, by the evaluation method in the related art, a cell may be incorrectly evaluated as safe, even when the cell can be relatively danger depending on a place inside the cell at which an internal short-circuit occurs.

Therefore, for avoiding an error evaluation to be safe, it is important to generate phenomena due to occurring an internal short-circuit at an arbitrary place while taking a shape or constituent elements of the cell into account. As a result, the internal short-circuit safety of the cell can be correctly evaluated.

An object of the invention is to provide a secondary cell in which a place where phenomena due to occurring an internal short-circuit can be arbitrarily set, an internal variation in the secondary cell during occurrence of an internal short-circuit can be correctly recognized, and safety of the cell with respect to an internal short-circuit can be accurately evaluated. And further, the invention provides a method of testing the secondary cell with considering the internal short-circuit phenomena.

Solution to Problem

To achieve the above-described object, according to an aspect of the invention, there is provided the following secondary cell.

[1] A secondary cell including: an electrode group that is formed by winding or laminating a positive electrode plate, a negative electrode plate, and an insulating layer that is disposed between the positive electrode plate and the negative electrode plate; and a heat generating body configured to heat a local portion of the electrode group, the heat generating body being disposed between the positive electrode plate and the insulating layer or between the negative electrode plate and the insulating layer.

[2] The secondary cell according to [1],
wherein the heat generating body further includes a conductive wire that connects the heat generating body to an external power supply.

[3] The secondary cell according to [1] or [2],
wherein the heat generating body includes a linear heater formed in a spiral, and an insulating layer that is interposed between parts of the linear heater, the parts being adjacent to each other in an axial direction of the spiral.

[4] The secondary cell according to [1] or [2],
wherein the heat generating body includes a linear heater formed in a whirlpool, and parts of the linear heater do not come into contact with each other.

[5] The secondary cell according to [1] or [2],
wherein the heat generating body includes a sheet-shaped heater folded in a zigzag manner, and an insulating layer that is interposed between parts of the sheet-shaped heater, the parts being adjacent to each other in an overlapping direction of the sheet-shaped heater.

In addition, to achieve the above-described object, according to another aspect of the invention, there is provided the following method.

[6] A method of testing a secondary cell by applying heat amount enough to occur an internal short-circuit in the secondary cell to the cell including an electrode group that is formed by winding or laminating a positive electrode plate, a negative electrode plate, and an insulating layer that is disposed between the positive electrode plate and the negative electrode plate, the method including:

a process of instantaneously heating a local portion of the electrode group to a predetermined temperature using a heat generating body that is disposed between the positive electrode plate and the insulating layer or between the negative electrode plate and the insulating layer, the predetermined temperature at which the internal short circuit occurring.

[7] The method of testing a secondary cell according to [6], wherein the heat generating body contains a magnetic substance, and the local portion of the electrode group is instantaneously heated to the predetermined temperature by applying an electromagnetic force to the magnetic substance from the outside of the secondary cell.

Advantageous Effects of Invention

According to the invention, a place where a phenomenon due to an internal short-circuit occurs can be arbitrarily set, an internal variation of the secondary cell during occurrence of an internal short-circuit can be correctly recognized, and safety of the secondary cell with respect to an internal short-circuit may be correctly evaluated.

DESCRIPTION OF EMBODIMENTS

[Secondary Cell]

Figure 1:
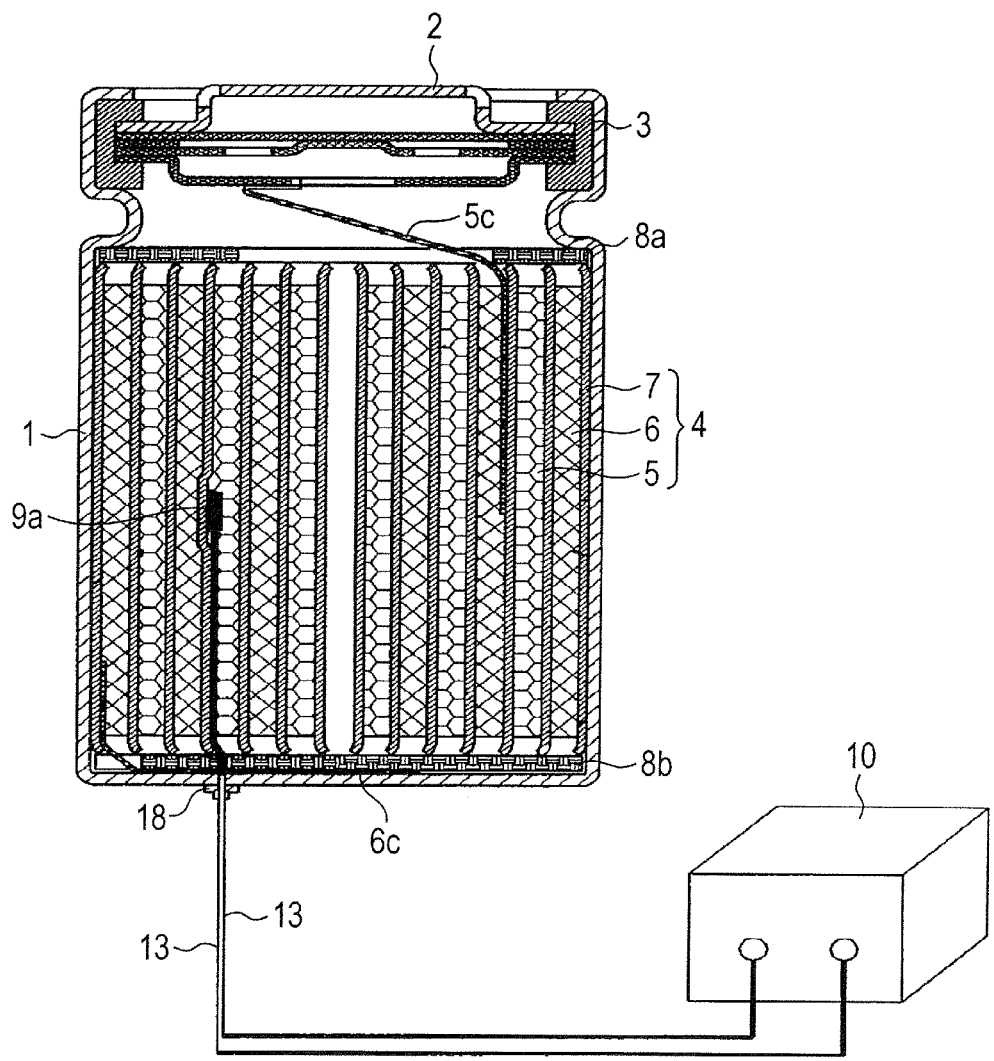
FIG. 1 is a longitudinal cross-sectional diagram illustrating a configuration of a secondary cell in Embodiment 1.

A secondary cell of the invention includes: an electrode group that is formed by winding or laminating a positive electrode plate, a negative electrode plate, and an insulating layer that is disposed between the positive electrode plate and the negative electrode plate; and a heat generating body that is disposed between the positive electrode plate and the insulating layer or between the negative electrode plate and the insulating layer. And also, the heat generating body can heat a local portion of the electrode group.

The secondary cell of the invention may be configured to include the heat generating body, and other features can be same as those of a known secondary cell. For example, the electrode group may be configured like an electrode group that is commonly used as an electrode group of a secondary cell. In addition, the secondary cell of the invention can be configured by further using various members that are commonly used as constituent elements of a secondary cell in addition to the electrode group and the heat generating body.

The heat generating body heats a local portion of the electrode group. It is preferable that the heat generating body be capable of being arranged at any position regardless of the inside or the outside of the electrode group.

It is preferable that the size of the heat generating body be 1 mm×7 mm×15 mm or less, more preferably 0.7 mm×5 mm×13 mm or less, and still more preferably 0.5 mm×3 mm×7 mm or less from a viewpoint of sufficiently heating only the local portion. In addition, it is preferable that the size of the heat generating body be 0.3 mm×2 mm×4 mm or more, and more preferably 0.5 mm×3 mm×7 mm or more from a viewpoint of applying heat amount enough to occur an internal short-circuit to the local portion.

The temperature of the local portion is raised to, for example, 170 to 200° C. by the heat generating body. The time necessary for a temperature rise in the local portion is preferably 3 to 6 seconds, and more preferably 1 to 3 seconds from a viewpoint of heating only the local portion.

The heat generating body may be a member that is independently disposed in the secondary cell and is capable of heating the local portion. The heat generating body that is capable of independently heating the local portion can be a sheet or particles containing a magnetic substance such as SUS303, S45C, and SS400. Such a heat generating body can be used to heat the local portion by applying an electromagnetic force to the heat generating body from the outside of the secondary cell. In a case of using such heat generating body, members other than the heat generating body in the secondary cell is made of a non-magnetic substance (for example, aluminum, copper, a polymeric material, and the like). This heat generating body can be conveniently produced. In addition, this heat generating body can provide a situation similar to the original internal short-circuit.

As the heat generating body, an electrothermal heater may be used. In this case, the heat generating body may further include a conductive wire that connects the heat generating body to an external power supply device. This heat generating body can include a heater (a heat generating material) that is wound or folded. The heat generating material can be made of a conductive substance having an appropriate resistance. The conductive wire is used to supply electricity to the heat generating material. The conductive wire can be directly connected to an external power supply device. Installation of the conductive wire may be performed by forming a penetration hole at a part of a case accommodating the electrode group, and arranging the conductive wire which penetrates through the penetration hole. In addition, the conductive wire may be connected to the external power supply device through another conductive wire. This installation of the conductive wire may be performed by providing a connector to a part of the case, the connector connecting a conductive wire inside the case with a conductive wire outside the case.

[Method of Testing Secondary Cell]

The method of testing the secondary cell is a method of testing a secondary cell by applying heat amount to the secondary cell, the heat amount being enough to occur an internal short-circuit. The secondary cell includes an electrode group that is formed by winding or laminating a positive electrode plate, a negative electrode plate, and an insulating layer that is disposed between the positive electrode plate and the negative electrode plate. This method includes a process of instantaneously heating a local portion of the electrode group to a temperature at which an internal short circuit occurs using a heat generating body that is disposed between the positive electrode plate and the insulating layer or between the negative electrode plate and the insulating layer. The test method may be performed by using the above-described secondary cell of the invention. "The method of testing the secondary cell" includes a method of testing the secondary cell itself and a method of testing a peripheral instrument for an effect caused by the secondary cell.

The process of heating the local position may be performed by applying sufficient energy for heating the local portion to the heat generating body, the sufficient energy being dependent on a configuration of the heat generating body. In a case where the heat generating body is formed from a magnetic substance, the local heating process may be performed by disposing the secondary cell in a magnetic field configured to apply an electromagnetic force to the heat generating body of the secondary cell. At this time, an induction current due to the electromagnetic force flows to the heat generating body so as to raise the temperature of the heat generating body.

In addition, in a case where the heat generating body includes the heat generating material and the conductive wire, the local heating process may be performed by supplying an electric power of wattage to the heat generating body, the electric power being equal to or larger than a predetermined value. The supplied electric power may be determined in accordance with the structure of the heat generating body.

The test method of the invention may further include other processes, in addition to the local heating process, within a range in which the effect of the invention may be obtained. For example, it is preferable that the method further includes a process of sufficiently charging the secondary cell before the local heating process.

The invention may be used for testing secondary cell single body for stability. Commonly, this test may be performed by applying heat in an amount in order to rapidly increasing a temperature of the local portion to a temperature upon generating an internal short-circuit.

Furthermore, the invention may be used for testing an instrument or apparatus for stability by the local heating process, the instrument or apparatus being provided for conveyance or use of the secondary cell. Such a test may be performed by mounting the cell in the instrument or apparatus and by applying heat to the local portion in an amount in order to rapidly increase a temperature of the local portion to a temperature upon generating an internal short-circuit, until the secondary cell is broken.

Hereinafter, embodiments of the invention will be described with reference to the attached drawings.

Figure 2:
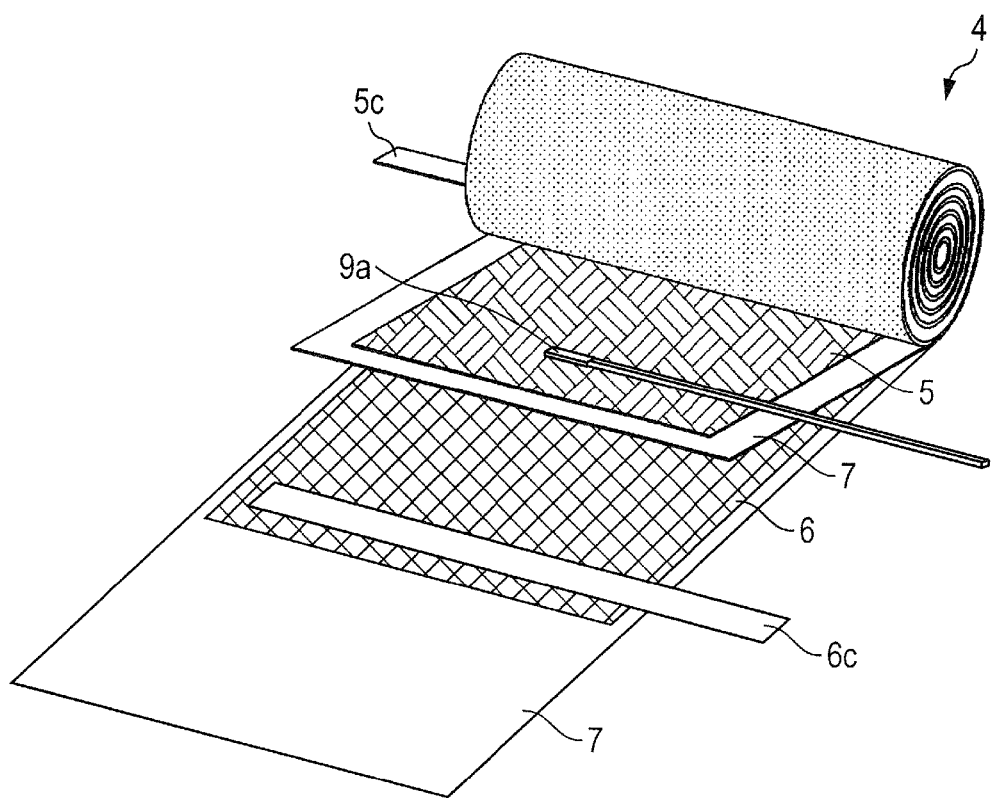
FIG. 2 is a perspective diagram illustrating a winding method of the secondary cell in Embodiment 1.

FIG. 1 shows a diagram illustrating a configuration of the secondary cell in one embodiment. FIG. 2 shows a diagram illustrating an embodiment of electrode group 4 shown in FIG. 1. In FIG. 2, the same reference numerals will be given to substantially the same constituent elements as FIG. 1, and description thereof will be omitted.

The secondary cell shown in FIG. 1 includes case 1, cap 2 that is disposed at an end of case 1, electrode group 4 that is accommodated in case 1, and heat generating body 9a that is disposed in electrode group 4. An electrolytic solution is further accommodated in case 1. Positive electrode current collector plate 5c electrically connecting positive electrode plate 5 of electrode group 4 with cap 2 is disposed in case 1 on one end side thereof. Negative electrode current collector plate 6c electrically connecting negative electrode plate 6 of electrode group 4 with bottom surface of case 1 is disposed in case 1 on the other end side thereof.

Upper insulating plate 8a is disposed between negative electrode plate 6 of electrode group 4 and positive electrode current collector plate 5c. Lower insulating plate 8b is disposed between electrode group 4 and case 1. Upper insulating plate 8a prevents short-circuit between negative electrode plate 6 and positive electrode current collector plate 5c of electrode group 4. Lower insulating plate 8b prevents short-circuiting between positive electrode plate 5 and negative electrode current collector plate 6c of electrode group 4.

Conductive wire 13 is connected to heat generating body 9a. On the other hand, a penetration hole is formed in lower insulating plate 8b and bottom plate of case 1. Conductive wire 13 is led out to the outside of case 1 through cap 18 that tightly seals a gap between the penetration hole and the conductive wire. Conductive wire 13 is connected to external power supply 10.

Instead of cap 18, a connector may be used, the connector being connected to the conductive wire inside of case 1 and tightly sealing the penetration hole. In this case, the connector and external power supply 10 can be connected to each other through conductive wire 13 only when performing heat generation with heat generating body 9a. Accordingly, exterior appearance of the secondary cell becomes relatively simple, and thus use of a secondary cell becomes relatively easy.

Case 1 is a bottomed cylindrical container that is formed from a conductive material. The bottom surface of case 1 serves as one electrode (negative electrode) of the secondary cell. A cross-sectional shape of case 1 is a circular shape, but may be an elliptical shape or a polygonal shape. Alternatively case 1 may be tube of which both ends are opened. In this case, a cap, which has a conductive unit serving as an electrode of the secondary cell, is disposed at each of both ends of case 1. In this case, case 1 may be formed from a non-conductive material.

Cap 2 tightly seals one end opening of case 1 with gasket 3. Cap 2 is formed from a conductive material, and serves as the other electrode (positive electrode) of the secondary cell. Cap 2 is provided with a safety valve that prevents case 1 from being fractured due to an increase in internal pressure by an abnormal state such as internal short-circuit. Cap 2 is mechanically mounted together with gasket 3 to the one end of case 1 which is narrowed down. Gasket 3 is formed from an elastic body so as to tightly seal a gap between cap 2 and case 1.

Electrode group 4 is produced by winding a laminated sheet. The laminated sheet is configured by overlapping insulating layer 7, negative electrode plate 6, insulating layer 7, and positive electrode plate 5 in this order from the bottom side (FIG. 2). Positive electrode current collector plate 5c is disposed on positive electrode plate 5. And also, positive electrode current collector plate 5c protrudes from one side edge of the laminated sheet at a winding start edge of the laminated sheet. Negative electrode current collector plate 6c is disposed on negative electrode plate 6. And also, negative electrode current collector plate 6c protrudes from the other side edge of the laminated sheet at the winding termination edge of the laminated sheet. In addition, heat generating body 9a is disposed on positive electrode plate 5c at an arbitrary position in a longitudinal direction of the laminated sheet, and protrudes from the other side edge of the laminated sheet.

Positive electrode plate 5 is produced by applying a positive electrode mixture paste on both surfaces of aluminum foil, drying the applied positive electrode mixture paste, and pressing the resultant object using a pressing roll. Positive electrode current collector plate 5c is formed from a conductive material. Negative electrode plate 6 is produced by applying a negative electrode mixture paste on both surfaces of copper foil, drying the applied negative electrode mixture paste, and pressing the resultant object using a pressing roll. Negative electrode current collector plate 6c is formed from a conductive material. Insulating layer 7 is a sheet formed from an insulating form product having interconnected cells inside thereof. An electrolytic solution for carrying out ion exchange may be collected in interconnected cells of insulating layer 7.

In addition, FIG. 2 illustrates cylindrical electrode group 4 obtained by winding the laminated sheet. Electrode group 4 may be configured by laminating a cut laminated sheet in a multi-layer.

Heat generating body 9a is interposed between positive electrode plate 5 and insulating layer 7 or between negative electrode plate 6 and insulating layer 7, and is embedded in electrode group 4 by winding or laminating the laminated sheet. As described above, electrode group 4 shows a low electrical resistance in the vicinity of the current collector plate, and shows a high electrical resistance at a position that is distant from both of the positive electrode current collector plate and the negative electrode current collector plate. It is preferable that a position where heat generating body 9a is interposed in the laminated sheet is a position at which the electrical resistance is the highest, from a viewpoint that stability evaluation test of the cell may be performed in a relatively strict manner. The position at which the electrical resistance is the highest is a middle-point position between both electrode plates in a radial direction of a roll in which the laminated sheet is wound.

Figure 3A:
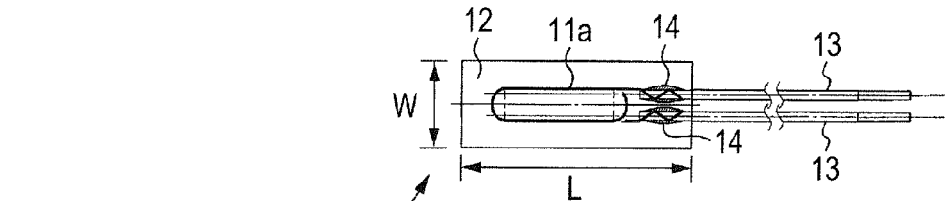
FIGS. 3A-3CD are diagrams illustrating structures of a heat generating body that are used in the invention.
Figure 3B:
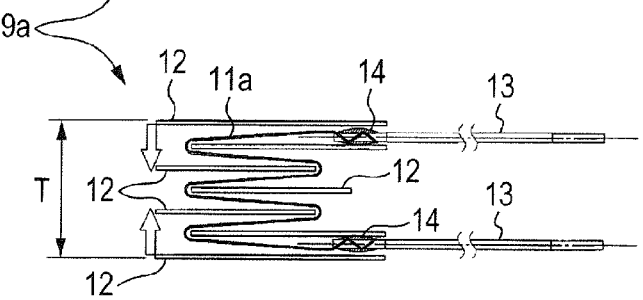
Figure 3C:
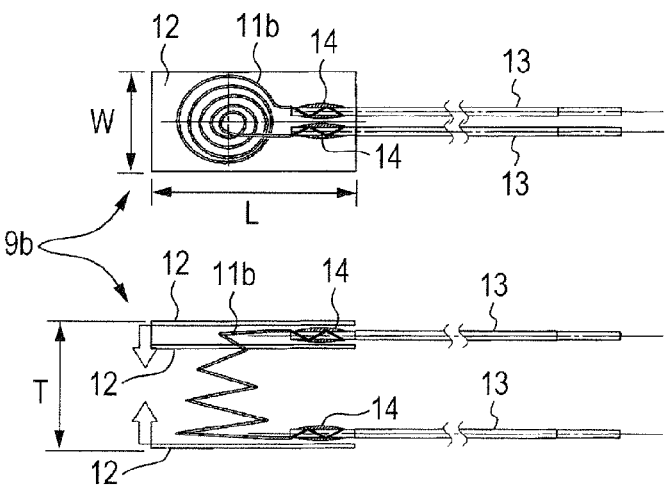

FIGS. 3A-3C show diagrams illustrating structures of the heat generating body in this embodiment of the invention.

As shown in FIG. 3A, heat generating body 9a includes linear heat generating material 11a having a spiral shape and insulating layer 12 that is interposed between parts of heat generating material 11a, the parts of the heat generating material being adjacent to each other in an axial direction of a spiral. Heat generating body 9a further includes conductive wire 13 that is individually connected to both ends of heat generating material 11a, and joint portion 14 between heat generating material 11a and conductive wire 13. The planar shape of the spiral is a thin and long track shape. Heat generating body 9a of FIG. 3A is configured as a two-layer or more laminated body by winding heat generating material 11a while bending heat generating material 11a and by interposing each insulating layer 12 between the parts of heat generating material 11a, the parts being adjacent to each other. As a result, the parts of heat generating material 11a do not come into contact with each other in the axial direction of the spiral. In addition, insulating layer 12 is disposed at both ends of the spiral in the axial direction. These laminated structures adhere to each other in the axial direction to configure heat generating body 9a.

Both ends of heat generating material 11a are electrically connected to each other through conductive wire 13 at joint portion 14. Connection at joint portion 14 is performed by silver brazing (or soldering). It is preferable that joint portion 14 have heat resistance at a heat generating temperature (approximately 250° C.) of heat generating body 9a and resistance to an electrolytic solution (strong alkali). Commonly, conductive wire 13 is covered with an insulating film. Similarly to joint portion 14, it is preferable that the film have heat resistance and alkali resistance.

As shown in FIG. 3B, the heat generating body in the embodiment of the invention may be heat generating body 9b that includes linear heat generating material 11b having a whirlpool shape, and parts of heat generating material 11b do not come into contact with each other. Heat generating material 11b is wound in a whirlpool shape. Each insulating layer 12 is disposed between parts of heat generating material 11b, the parts overlap each other in the axial direction at a central portion of the whirlpool shape. In addition, insulating layer 12 is disposed at both ends of the whirlpool in the axial direction. These laminated structures adhere to each other in the axial direction of the whirlpool to configure heat generating body 9b.

In heat generating body 9b, heat generating material 11b is disposed in an approximately planar shape. In addition, number of insulating layers 12 in heat generating body 9b is smaller than that in heat generating body 9a. Therefore, heat generating body 9b has an advantage over heat generating body 9a in that the thickness of the heat generating body may be smaller.

As shown in FIG. 3C, the heat generating body in the embodiment of the invention may be heat generating body 9c that includes sheet-shaped heat generating material 11c that is folded in a zigzag manner, and insulating layer 12 that is interposed between parts of heat generating material 11c, the parts being adjacent to each other in an overlapping direction of heat generating material 11c. Heat generating material 11c is folded in a zigzag manner. Each insulating layer 12 is disposed between the parts of heat generating material 11c, the parts being adjacent to each other in the overlapping direction of heat generating material 11c. In addition, insulating layer 12 is also disposed at both ends of the folded body in the overlapping direction. These laminated structures are adhere to each other at a tip end portion or a base end portion of heat generating body 11c in the overlapping direction to configure heat generating body 9c.

Since heat generating material 11c has a sheet shape (foil shape), the thickness of heat generating body 9c may be made to be smaller than that of heat generating body 9a. In addition, heat generating material 11c may be produced by cutting a sheet-shaped material and by bending the resultant cut object. Accordingly, manufacturing cost reduction may be realized.

In addition, a production method in which heat generating materials 11a to 11c are coated with an insulating material (polyimide, glass, or the like) may be considered. In this case, insulating layer 12 becomes unnecessary, and thus additional miniaturization of the heat generating body becomes possible.

A material having a large electrical resistance is preferable as a material of heat generating materials 11a to 11c. General examples of such material include nichrome. In addition, a Kanthal wire (iron chrome wire), tungsten, or the like may be preferable. Furthermore, the heat generating materials are produced by selecting the material in consideration of small size, high capacity, and durability and in accordance with the shape of the heat generating bodies.

Heat generating body 9a has a size that is capable of being wound on electrode group 4. More specifically, heat generating body 9a has a type that does not hinder adhesiveness between positive electrode plate 5 and insulating layer 7 or between negative electrode plate 6 and insulating layer 7. When the adhesiveness between the electrode plate and the insulating layer in electrode layer 4 is hindered due to heat generating body 9a, thermal conductivity from the heat generating body to the electrode group deteriorates. Accordingly, it takes a long time for a thermal runaway to occur, and thus it is difficult for the local thermal runaway to occur. From this viewpoint, for example, a width W in a planar shape of each of heat generating bodies 9a to 9c is 3 to 7 mm, a length L in the planar shape is 7 to 15 mm, and a thickness T after adhesion is 0.5 to 1 mm.

Figure 4A:
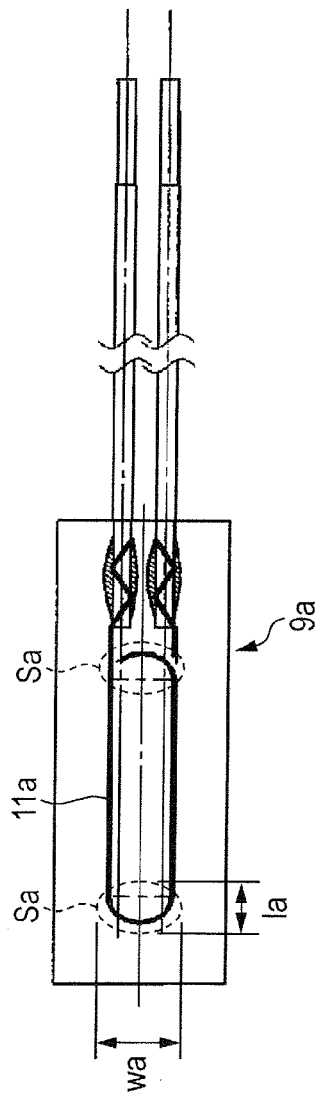
FIGS. 4A-4C are diagrams illustrating the heat generating body that is used in the invention.

In addition, as shown in FIG. 4A, heat generating body 9a includes regions Sa at ends of the track shape. At each of the regions Sa, heat generating material 11a is bent with a large curvature, and the bent parts of heat generating material 11a overlap each other. In the region Sa, the size wa in the lateral direction of heat generating body 9a is 2 to 6 mm, and the size 1a of heat generating body 9a in the longitudinal direction is 2 to 6 mm.

Figure 4B:
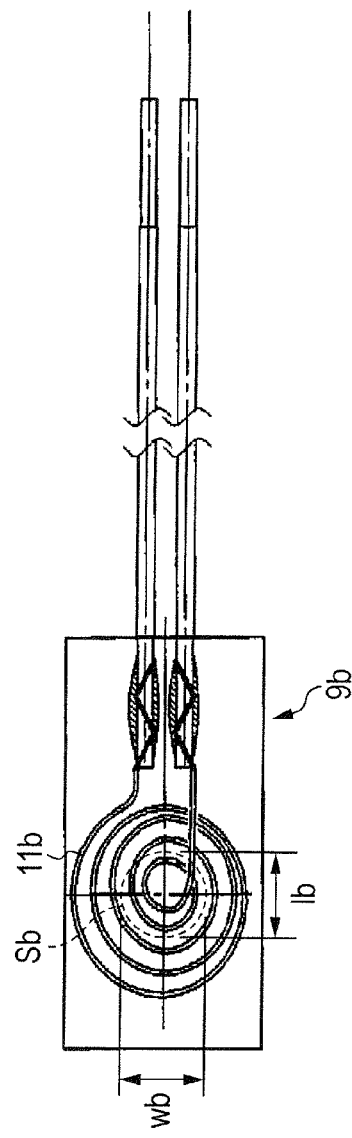

As shown in FIG. 4B, heat generating body 9b includes a region Sb at a central portion of the whirlpool shape. At the region Sb, heat generating material 11b is bent with a large curvature, and the bent parts of heat generating material 11b overlap each other. In the region Sb, the size wb in the lateral direction of heat generating body 9b is 2 to 6 mm, and the size 1b of heat generating body 9b in the longitudinal direction is 2 to 6 mm.

Figure 4C:
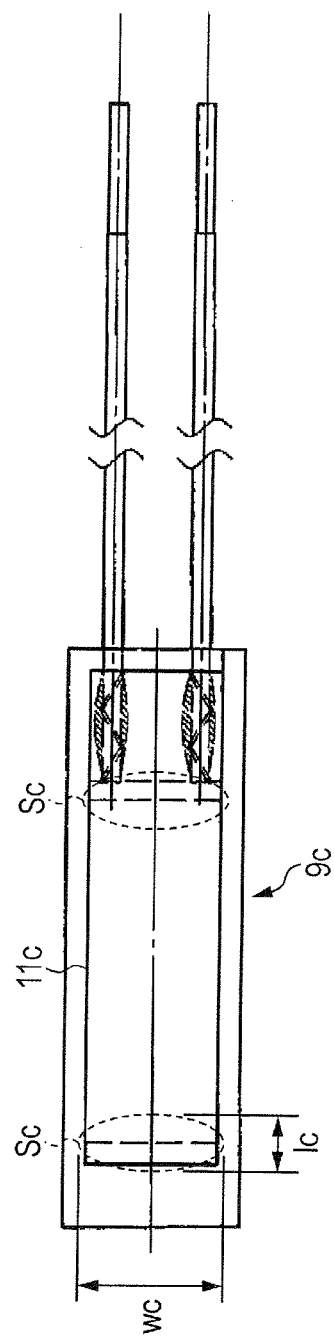
Figure 5:
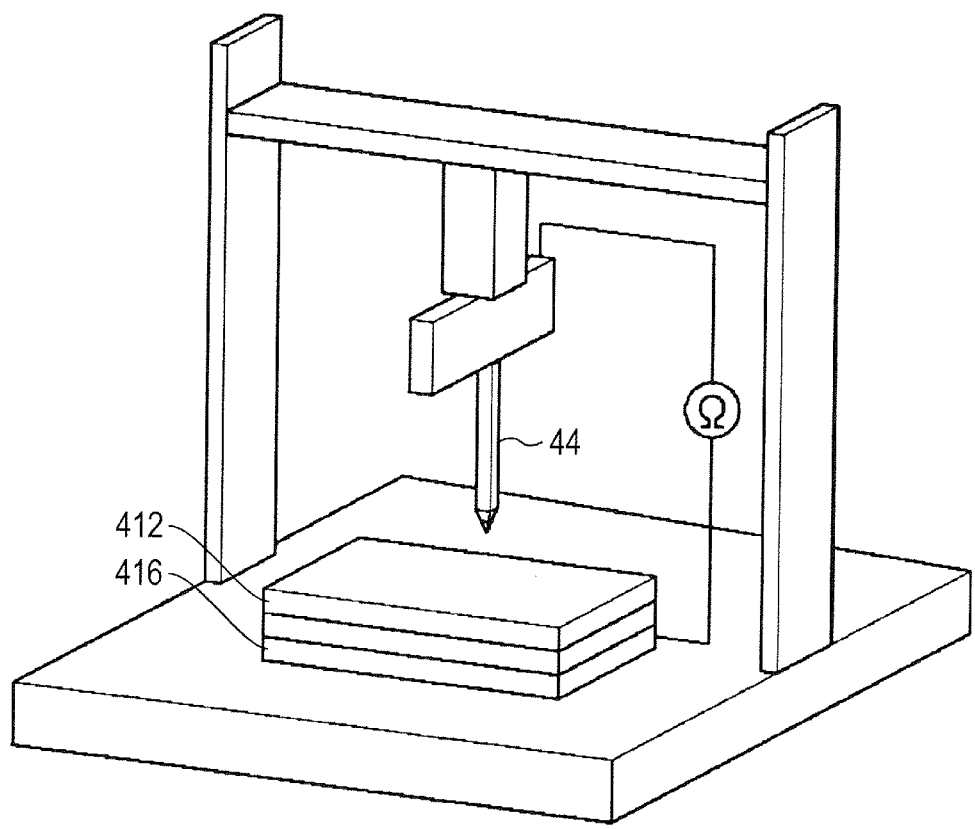
FIG. 5 is a diagram illustrating a nail penetration test described in PTL 2.
Figure 6A:
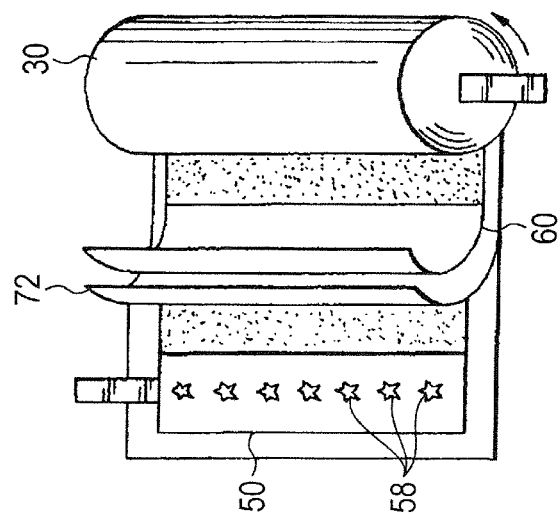
FIGS. 6A-6B are diagrams illustrating a cell in the related art that is described in PTL 3.
Figure 6B:
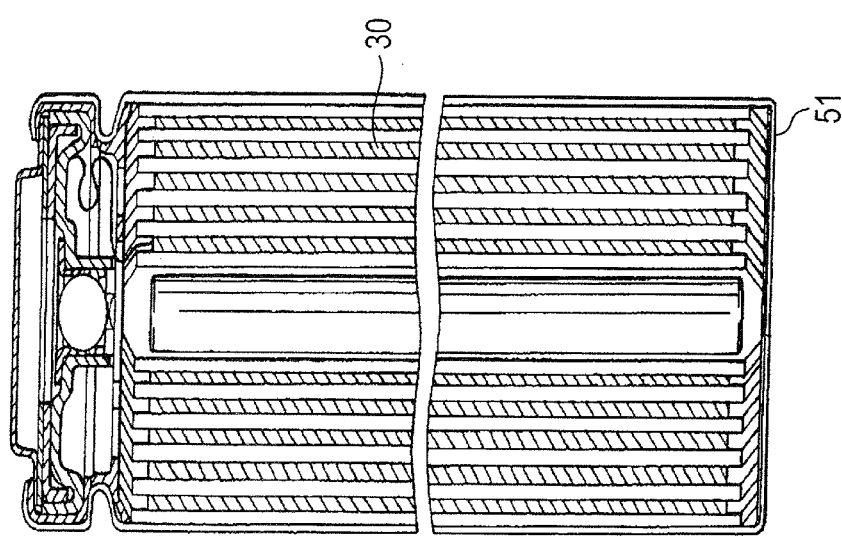

As shown in FIG. 4C, heat generating body 9c includes regions Sc at the ends of the folded body. At each of the regions Sc, heat generating material 11c is bent with a large curvature, and the bent parts of heat generating material 11c overlap each other. In the region Sc, the size we in the lateral direction of heat generating body 9c is 2 to 6 mm, and the size 1c of heat generating body 9c in the longitudinal direction is 2 to 6 mm.

For an actual internal short-circuit, it is considered that joule heat occurs at a temperature of 170 to 200° C. according to an experiment in the past. Accordingly, the heat generating body 9a has a heat generation capacity that is enough large to generate the temperature.

The cell shown in FIG. 1 may be manufactured by the following method.

First, heat generating body 9a is accommodated in case 1, and conductive wire 13 is led out from the inside of case 1 to the outside through the penetration hole formed in the bottom of case 1. Subsequently, heat generating body 9a is interposed between positive electrode plate 5 or negative electrode plate 6 and insulating layer 7 so as to configure the laminated sheet. Subsequently, the laminated sheet is wound to produce electrode group 4. Subsequently, electrode group 4 is accommodated inside case 1 while conductive wire 13 is pulled from the outside of case 1. Other manufacturing works may be performed according to a common method in the manufacturing of a secondary cell, the works including installation of lower insulating plate 8b, electrical connection between negative electrode current collector plate 6c and lower insulating plate 8b, installation of cap 2, electrical connection between positive electrode current collector plate 5c and the cap, and accommodation of the electrolytic solution.

For example, an electric power of 25 W is supplied to heat generating body 9a from external power supply 10. At this time, electricity flows through heat generating material 11a, and thus the temperature of heat generating material 11a rises to approximately 200° C. for one to six seconds. Accordingly, the temperature of the thin and long track-shaped part of heat generating body 9a rises to approximately 200° C. Due to the temperature rising, a local portion of electrode group 4 is heated to a temperature of approximately 200° C., and thus the thermal runaway (combustion) at the local portion, the thermal runaway to occur under an internal short-circuit.

When observing a burned region of electrode group 4 after the thermal runaway, it can be seen that the thermal runaway is initiated from a very small region compared to a planar shape of heat generating body 9a. This initiation region is the location of the region Sa of heat generating body 9a disposed inside electrode group 4. In addition, the size of the initiation region is 1 to 2 mm square. It is considered that: the temperature of heat generating body 9a particularly rises at the region Sa, the curvature of the region Sa being relatively large, and heat generating material 11a overlapping at the region Sa; and the thermal runaway occurs at a part of electrode group 4, the part coming into contact with the region Sa. In heat generating body 9b, it is considered that the temperature of the region Sb rises at a particularly significant degree similarly to the region Sa. In addition, in heat generating body 9c, the temperature of the region Sc rises at a particularly significant degree similarly to the region Sa.

As described above, in the above-described heat generating bodies, the heat generating material includes one or both of the part that is folded with a radius of curvature of 3 mm or less (for example, 1 to 3 mm) and the part at which the heat generating material overlap each other. Therefore, a region (local portion) in electrode group 4, the region being smaller than the planar shape of the heat generating body, can be heated. As a result, the same thermal runaway as the internal short-circuit can occur. This small region (local portion) is considered to be a region of a size corresponding to a region that is heated by generated joule heat when foreign matter infiltrating the inside of the cell causes an internal short-circuit.

In addition, in a case where case 1 is formed from a non-magnetic substance (for example, aluminum, copper, a polymeric material, or the like), a magnetic substance member as a heat generating body having a size of each of the above-described heat generating bodies or a size of each of the regions (Sa to Sc) may be disposed at an arbitrary position inside electrode group 4. This secondary cell is disposed, for example, in an appropriate magnetic field, and electromagnetically induced energy by an electromagnetic force is applied to the heat generating body. In this manner, when the electromagnetic force is applied to the heat generating body formed from the magnetic substance from the outside of the secondary cell, a current induced by the electromagnetic force flows through the heat generating body, and thus the temperature of the heat generating body rises. In this case, conductive wire 13 or cap 18 may be further omitted, and thus production of the heat generating body becomes more convenient. In addition, since the penetration hole of case 1 becomes unnecessary, production of the secondary cell itself also becomes easy. Furthermore, since the secondary cell does not have a penetration hole, a situation similar to the internal short-circuit in the secondary cell may be provided.

Next, a test method using the secondary cell will be described.

For example, the charging process before the local heating process may be performed as described below. First, the secondary cell is charged until it reaches a specified voltage, and is stored under an environment of 45° C. for 7 days. Then, charging is performed again.

For example, the local heating process may be performed as described below. First, the cell of which charging is terminated is put into a thermostatic chamber. A voltage meter is connected between cap 2 and case 1 to measure the voltage of the secondary cell. In addition, a thermocouple is attached to the central portion of case 1 to measure the surface temperature of the secondary cell. Then, the secondary cell is left as is for 30 to 60 minutes until the secondary cell becomes stable at 45° C. Next, electric power is supplied from power supply device 10 to heat generating body 9a to cause heat generating body 9a to generate heat.

In a case of a secondary cell having low stability, when a local portion of electrode group 4 reaches a temperature (170 to 200° C.) which is equal to or higher than joule heat due to an internal short-circuit, the chemical reactions which can occur by internal short-circuit occurs at the local portion due to heat emitted from heat generating body 9a. The chemical reactions can include: generating oxygen and occurring combustion. The chemical reactions propagate around the local portion in a short time, and ultimately the temperature and pressure inside the secondary cell rise. When the pressure reaches a pressure that is equal to or higher than the allowable pressure of a safety valve of cap 2, a gas generated inside the secondary cell blow out suddenly and is combusted before the voltage of the secondary cell drops.

On the other hand, in a case of a cell having high stability, the gas does not blow out or is combusted, and only dropping of the voltage of the secondary cell and heat generation of case 1 occur. As an index of stability of the secondary cell, "initial voltage dropping of a cell occurs, but smoking, ignition, and fracturing of an exterior body do not occur" becomes a determination reference similarly to the nail penetration test or the crushing test.

As described above, according to the invention, it is possible to accurately provide the same phenomenon as an internal short-circuit due to the infiltration of foreign matter into the secondary cell at an arbitrary region inside the secondary cell. In addition, the invention may be used for a stability test of a secondary cell single body. Examples of this test include determination of mechanical strength or insulation property of insulating layer (separator) 7 between electrode plates of the secondary cell, an operation test of the safety valve of cap 2.

For example, the safety test of an instrument or apparatus that is provided for conveyance or use of the secondary cell may be performed as described below.

(Safety Evaluation Test of Cell Pack)

An article, which is obtained by connecting a plurality of lithium secondary cells in parallel or in series, is called a cell pack. In recent years, development of the lithium secondary cell as a power supply of a portable device and for use in electric vehicles has been actively conducted, and the cell pack has been suggested in various types.

The lithium secondary cell is configured to have a relatively high energy density. Therefore, in the cell pack, when one cell is broken and combusted due to an internal short-circuit, there is a problem in that this phenomenon has an effect on the other cells that are adjacent to the cell in a chain manner, and thus the adjacent cells are broken and combusted in the same manner. This is called "catching fire property" of the cell pack. Generally, one cell of the cell pack is penetrated with a nail in the nail penetration test to determine whether or not smoking or ignition in adjacent cells occurs so as to determine this catching fire property. However, the cell pack has various types, such as two-stage lamination and three-stage lamination. Accordingly, it is difficult to penetrate a cell with a nail, the cell is hidden inside among cells of the cell pack. As a result, there is a problem in that it is difficult to correctly determine the catching fire property of the cell pack.

As catching fire property evaluation means of the cell pack, the secondary cell of the invention is embedded at an arbitrary place of the cell pack for an electric vehicle or the like. Then, the secondary cell is caused to smoke and fire according to a test method of the invention. As a result, it is possible to evaluate whether or not other adjacent cells catch fire. In this manner, when the safety evaluation test of the cell pack is performed using the test method of the invention, even in any secondary cell that is disposed at an arbitrary position in the cell pack, it is possible to perform the determination on whether or not the catching fire property of the cell pack is accepted. Therefore, it is possible to take a measure for improvement in safety of the cell pack through improvement in the heat dissipation design and a lay-out design.

(Safety Evaluation Test of Cell Conveyance Tray)

A tray which accommodates a predetermined number of cells is used for conveyance of the secondary cell. The tray is mainly used for conveyance of the secondary cell on the manufacturing floor. In addition, the tray may be temporarily integrated in which the secondary cell is accommodated therein. Therefore, it is also necessary to suppress the catching fire property in the tray.

One secondary cell of the invention is accommodated in the tray, and a pseudo internal short-circuit phenomenon is caused to occur in the secondary cell using the method of the invention so as to combust the secondary cell. According to this method, a determination on the catching fire property from the cell to the tray may be performed.

A plurality of the secondary cells of the invention are accommodated in the tray which has a structure that suppresses the catching fire property between cells, and a pseudo internal short-circuit phenomenon is caused to occur in any one of the secondary cells using the method of the invention so as to combust the secondary cell. A test on the tray can be performed by observing the presence or absence of catching fire, with respect to: the tray catching fire from a secondary cell that is being combusted; and another cell that is accommodated in the tray catching fire from the secondary cell that is being combusted.

As described above, according to this embodiment, it is possible to provide a secondary cell in which a part at which the internal short-circuit of the secondary cell occurs may be arbitrarily set, phenomenon during occurrence of an internal short-circuit may be correctly grasped, and safety of the secondary cell during the occurrence of the internal short-circuit may be correctly evaluated, and a test method using a secondary cell accompanied with a pseudo internal short-circuit phenomenon.

EXAMPLES

Hereinafter, the invention will be described in detail on the basis of examples, but the invention is not limited to the following examples.

The secondary cell shown in FIG. 1 was prepared. First, a cobalt lithium oxide powder, polyvinylidene fluoride, N-methyl-2-pyrrolidone, and acethylene black were agitated to produce a positive electrode mixture paste. The positive electrode mixture paste was applied to both surfaces of aluminum foil having a thickness of 20 µm, the applied positive electrode mixture paste was dried, and the resultant object was pressed using a pressing roll to have a thickness of 180 µm to prepare positive electrode plate 5. In addition, positive electrode current collector plate 5c was set to an aluminum sheet.

In addition, an artificial graphite powder, a modified styrene butadiene rubber particle, carboxymethyl cellulose, and water were agitated to prepare a negative electrode mixture paste. The negative electrode mixture paste was applied to both surfaces of a copper foil having a thickness of 20 µm, the applied negative electrode mixture paste was dried, and the resultant object was pressed using a pressing roll to have a thickness of 180 µm to prepare negative electrode plate 6. In addition, negative electrode current collector plate 6c was set to an aluminum sheet.

Insulating layer 7 is a resin sheet having a three-layer structure of polypropylene-polyethylene-polypropylene having a thickness of 20 µm. This resin sheet has continuous pores at the inside thereof. Accordingly, insulating layer 7 can retain an electrolytic solution for ion exchange in the internal pores, and thus ion exchange between the positive electrode and the negative electrode can be performed.

Case 1 is a bottomed cylindrical iron container that is subjected to nickel plating. Gasket 3 was formed from an elastic body (PP resin) to have a hermetical sealing property between cap 2 and case 1.

As a heat generating body, heat generating body 9a shown in FIG. 3A was used. Linear heat generating material 11 was wound three times in a spiral shape. And also five insulating layers 12 were interposed between parts of heat generating material 11 respectively, the parts were adjacent to each other in a spiral axial direction. As a result, heat generating body 9a having a five-layer structure was prepared. A nichrome wire was used as heat generating material 11. Heat generating material 11 and conductive wire 13 were jointed at joint portion 14 by silver soldering so as to allow heat generating material 11 to be electrically connected to conductive wire 13. In addition, an enamel coated wire (polyimide film of 20 µm)

was used as conductive wire 13. The nichrome was used as heat generating material 11, but a material other than the nichrome may be used.

The size of heat generating body 9a was set to have dimensions of a thickness of 0.7 mm, a width of 4 mm, and a length of 10 mm, which does not hinder the adhesiveness between positive electrode plate 5 and insulating layer 7. In addition, it is necessary for heat generating body 9a to generate a high thermal energy of 40 W or more. Therefore, heat generating body 9a was produced using a material having a heat generating body resistance value of 10Ω and an allowable current value of 2 A or more. It is found according to an experiment in the past that the Joule heat due to an actual internal short-circuit is generated at 170 to 200° C. Therefore, it is necessary for heat generating body 9a to generate heat higher than the above-described range.

(Evaluation of Internal Short-Circuit Safety)

A secondary cell was manufactured, and warming-up charging and discharging were performed two times. Subsequently, charging was performed with a current value of 400 mA until it reaches 4.1 V, and the secondary cell was stored an environment of 45° C. for 7 days. In addition, charging was performed again under the following conditions, and the next test was performed.

Constant current charging: Current value of 1,575 mA/charging termination voltage of 4.25 V Low voltage charging: Charging voltage of 4.25 V/charging termination current of 100 mA Then, the secondary cell of which charging was terminated was put into a thermostatic chamber, and a voltage meter is connected between cap 2 and the bottom of case 1 to measure a terminal voltage of the secondary cell. Then, a thermocouple was attached to the central portion of the case to measure the cell surface temperature, and the secondary cell was left as is for 30 to 60 minutes until the secondary cell became stable at 45° C.

After the above-described preparations were terminated, electric power (2 A×20 V=40 W) was supplied to the heat generating body 9a from power supply device 10, and thus heat generating body 9a was caused to generate heat of 200° C. or higher for 1 to 6 seconds. When the heat reached a joule heat temperature or higher due to an internal short-circuit, the same chemical reaction as occurrence of the internal short-circuit occurs. As a result, oxygen is generated, and local combustion is caused to occur, and thus the temperature and pressure inside the secondary cell rise rapidly. In addition, when the inner pressure of the secondary cell reaches a pressure that is equal to or higher than an allowable pressure (0.2 MPa) of the safety valve provided to cap 2, the gas generated inside the secondary cell suddenly blows to the outside of the secondary cell and the smoking and ignition phenomenon was caused to occur.

As described above, it was confirmed that the same phenomenon as the internal short-circuit of the secondary cell due to the infiltration of the foreign matter can be simulated by using the test method of the invention.

Priority is claimed on Japanese Patent Application No. 2011-043477 filed Mar. 1, 2011. The content described in a specification of the patent application is incorporated herein by reference.

INDUSTRIAL APPLICABILITY

As described above, according to the invention, safety with respect to a secondary cell under an internal short-circuit may be correctly evaluated. Accordingly, the invention may be applied to an internal short-circuit test for safety evaluation of the secondary cell. In addition, the invention may be applied to a safety test with respect to the entire cell pack catching fire by performing the internal short-circuit test in a state in which the secondary cell is embedded in the cell pack in which a plurality of secondary cell are embedded.

REFERENCE SIGNS LIST

1 Case
2 Cap
3 Gasket
4 Electrode group
5 Positive electrode plate
5c Positive electrode current collector plate
6 Negative electrode plate
6c Negative electrode current collector plate
7, 72, 412 Insulating layer (separator)
8a Upper insulating plate
8b Lower insulating plate
9a to 9c Heat generating body
10 Power supply device
11a to 11c Heat generating material
12 Insulating layer
13 Conductive wire
14 Joint portion
18 Cap
30 Electrode assembly
44 Nail
50 Negative electrode
51 Housing
58 Burr
60 Positive electrode
416 Current collector
L Length of heat generating bodies 9a to 9c
1a to 1c Length of regions Sa to Sc
Sa to Sc Region
T Thickness of heat generating bodies 9a to 9c
W Width of heat generating bodies 9a to 9c
wa to we Width of regions Sa to Sc

The invention claimed is:

1. A secondary cell comprising:
a wound or laminated electrode group that has a positive electrode plate, a negative electrode plate, and an insulating layer that is disposed between the positive electrode plate and the negative electrode plate;
a heat generating body that is disposed between the positive electrode plate and the insulating layer or between the negative electrode plate and the insulating layer, the heat generating body heating a local portion of the electrode group; and
a conductive wire that electrically connects an external power supply device to the heat generating body disposed between the positive electrode plate and the insulating layer or between the negative electrode plate and the insulating layer,
wherein the conductive wire extends from an inside of the wound or laminated electrode group to an outside of the wound or laminated electrode group.

2. The secondary cell according to claim 1,
wherein the heat generating body includes a linear heat generating material having a spiral shape, and an insulating layer that is interposed between parts of the heat generating material, the parts of the heat generating material being adjacent to each other in an axial direction of a spiral.

3. The secondary cell according to claim 1,
wherein the heat generating body includes a linear heat generating material having a whirlpool shape, and parts of the heat generating material do not come into contact with each other.

4. The secondary cell according to claim 1,
wherein the heat generating body includes a sheet-shaped heat generating material that is folded in a zigzag manner, and an insulating layer that is interposed between parts of the heat generating material, the parts of the heat generating material being adjacent to each other in an overlapping direction of the heat generating material.

5. A method of testing a secondary cell by applying heat due to an internal short-circuit to the cell including a wound or laminated electrode group that has a positive electrode plate, a negative electrode plate, and an insulating layer that is disposed between the positive electrode plate and the negative electrode plate, the method comprising:

a process of heating a local portion of the wound or laminated electrode group to a temperature at which the internal short circuit occurs using a heat generating body that is disposed between the positive electrode plate and the insulating layer or between the negative electrode plate and the insulating layer, wherein the process of heating is performed by supplying electric power via a conductor that is electrically connected to the heat generating body disposed between the positive electrode plate and the insulating layer or between the negative electrode plate and the insulating layer, wherein the conductor extends from an inside of the wound or laminated electrode group to an outside of the wound or laminated electrode group.

* * * * *